United States Patent
Fulford et al.

(10) Patent No.: US 12,342,603 B2
(45) Date of Patent: Jun. 24, 2025

(54) PLURALITY OF DEVICES IN ADJACENT 3D STACKS IN DIFFERENT CIRCUIT LOCATIONS

(71) Applicant: Tokyo Electron Limited, Tokyo (JP)

(72) Inventors: H. Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 429 days.

(21) Appl. No.: 17/592,032

(22) Filed: Feb. 3, 2022

(65) Prior Publication Data

US 2023/0245929 A1 Aug. 3, 2023

(51) Int. Cl.
*H10D 84/01* (2025.01)
*H10D 30/01* (2025.01)
(Continued)

(52) U.S. Cl.
CPC ......... *H10D 84/016* (2025.01); *H10D 30/025* (2025.01); *H10D 30/63* (2025.01); *H10D 84/0128* (2025.01); *H10D 84/0167* (2025.01); *H10D 84/0195* (2025.01); *H10D 84/038* (2025.01); *H10D 84/83* (2025.01);
(Continued)

(58) Field of Classification Search
CPC ......... H01L 21/823487; H01L 21/8221; H01L 27/823412; H01L 21/823885; H01L 27/088; H01L 27/092; H01L 27/0688; H01L 29/66666; H01L 29/7827; H10D 84/016; H10D 84/0128; H10D 84/0167; H10D 84/0195; H10D 84/01; H10D 84/038; H10D 84/83; H10D 84/85; H10D 84/8311; H10D 84/8312; H10D 84/83135; H10D 84/83138; H10D 84/8314; H10D 84/8316; H10D 84/832; H10D 84/833; H10D 84/835; H10D 84/836; H10D 84/837; H10D 84/839; H10D 84/851; H10D 84/852; H10D 88/00; H10D 88/01; H10D 84/02;
(Continued)

(56) References Cited

U.S. PATENT DOCUMENTS 5,308,778 A * 5/1994 Fitch .................. H01L 27/0688
257/E29.267
5,308,782 A * 5/1994 Mazure ............... H01L 29/6675
257/E29.267
(Continued)

*Primary Examiner* — Michael M Trinh
(74) *Attorney, Agent, or Firm* — Oblon, McClelland, Maier & Neustadt, L.L.P.

(57) ABSTRACT

Aspects of the present disclosure provide 3D semiconductor structures and methods for fabricating the same. For example, the method can include forming a first multilayer stack over a substrate, forming a second multilayer stack over the first multilayer stack, forming a first opening through the first and second multilayer stack until uncovering a top surface of the substrate, forming in the first opening a first vertical field-effect transistor (VFET) over the substrate, and forming in the first opening a second VFET over the first VFET. The first VFET can include a first channel having a first length corresponding to a first thickness of a first layer of the first multilayer stack. The second VFET can include a second channel having a second length corresponding to a second thickness of a second layer of the second multilayer stack. The second thickness can be different from the first thickness.

17 Claims, 12 Drawing Sheets

(51) Int. Cl.
  *H10D 30/63* (2025.01)
  *H10D 84/03* (2025.01)
  *H10D 84/83* (2025.01)
  *H10D 84/85* (2025.01)
  *H10D 88/00* (2025.01)

(52) U.S. Cl.
  CPC ............. *H10D 84/85* (2025.01); *H10D 88/00* (2025.01); *H10D 88/01* (2025.01)

(58) Field of Classification Search
  CPC ...... H10D 84/03; H10D 84/035; H10D 84/05; H10D 84/07; H10D 84/08
  See application file for complete search history.

(56) References Cited

U.S. PATENT DOCUMENTS

| | | | |
|---|---|---|---|
| 2010/0019310 A1* | 1/2010 | Sakamoto ............. | H10B 43/27 |
| | | | 257/324 |
| 2017/0250115 A1* | 8/2017 | Guo .................... | H01L 29/4238 |
| 2020/0066875 A1* | 2/2020 | Balakrishnan ...... | H01L 29/6681 |
| 2021/0118873 A1* | 4/2021 | Zhou ................... | H01L 29/1037 |
| 2021/0184001 A1* | 6/2021 | Trivedi ................ | H01L 27/088 |
| 2022/0102345 A1* | 3/2022 | Gardner .......... | H01L 21/823885 |
| 2022/0254702 A1* | 8/2022 | Zhu ................ | H01L 21/823871 |

* cited by examiner

PLURALITY OF DEVICES IN ADJACENT 3D STACKS IN DIFFERENT CIRCUIT LOCATIONS

FIELD OF THE DISCLOSURE

The present disclosure relates to semiconductor fabrication, and, more particularly, to 3D semiconductor structures and methods of fabricating the same.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example especially on the micro- or nanoscale, various fabrication processes can be executed, such as film-forming depositions, etch mask creation, patterning, material etching and removal, and doping treatments. These processes can be performed repeatedly to form desired semiconductor device elements on a substrate. With microfabrication, transistors can have been created in one plane with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of one another.

SUMMARY 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (e.g., a central processing unit (CPU), a graphics processing unit (GPU), a field programmable gate array (FPGA) and a system on chip SoC)) is being pursued.

Aspects of the present disclosure provide a method for fabricating a three-dimensional (3D) semiconductor structure. For example, the method can include forming a first multilayer stack over a substrate, the first multilayer stack including a plurality of first layers. The method can also include forming a second multilayer stack over the first multilayer stack, the second multilayer stack including a plurality of second layers. The method can also include forming a first opening through the first and second multilayer stack until uncovering a top surface of the substrate, forming in the first opening a first vertical field-effect transistor (VFET) over the substrate, and forming in the first opening a second VFET over the first VFET. The first VFET can include a first channel having a first length corresponding to a first thickness of a first layer of the first multilayer stack. The second VFET can include a second channel having a second length corresponding to a second thickness of a second layer of the second multilayer stack. The second thickness can be different from the first thickness.

In an embodiment, the method can also include forming a second opening through the first and second multilayer stacks until uncovering the top surface of the substrate, forming in the second opening a third multilayer stack over the substrate, the third multilayer stack including a plurality of third layers, forming a third opening through the third multilayer stack until uncovering the top surface of the substrate, and forming in the third opening a third VFET over the substrate, the third VFET including a third channel having a third length corresponding to a third thickness of a third layer of the third multilayer stack, wherein the third thickness is different from the first thickness. In another embodiment, the method can also include forming in the second opening a liner between the first and second multilayer stack and the third multilayer stack. In another embodiment, the third layer can be a dielectric layer, and the method can also include removing the dielectric layer, coupling a third gate material to the third channel, and coupling a third metal material to the third gate material. In another embodiment, the third layer can be a metal layer. In another embodiment, the first and third openings can have different sizes and/or shapes. In another embodiment, the second opening can be cylindrical.

In an embodiment, at least one of the first and second layers can be a metal layer.

In an embodiment, a portion of the first layer can have a third thickness different from the first thickness to form a third layer of a third multilayer stack over the substrate, and the method can also include forming a second opening through the third multilayer stack until uncovering the top surface of the substrate, and forming in the second opening a third VFET over the substrate, the third VFET including a third channel having a third length corresponding to the third thickness of the third layer. In another embodiment, the first multilayer stack can be formed by forming the first layer, etching the first layer such that the portion of the first layer has the third thickness to form the third layer, and forming a dielectric layer on the third layer until being aligned with the first layer. In another embodiment, a portion of the second layer can have a fourth thickness different from the second thickness to form a fourth layer of a fourth multilayer stack, and the method can also include forming in the second opening the fourth VFET over the third VFET, the fourth VFET including a fourth channel having a fourth length corresponding to the fourth thickness of the fourth layer. In another embodiment, the first and second openings can have different sizes and/or shapes.

In an embodiment, the first and second channels can include different types of channel materials. In another embodiment, the first VFET can be formed by forming an epitaxial material on the substrate, growing a channel material on the epitaxial material to cover a vertical wall of the first layer to form the first channel, forming an opening through the channel material, and replacing the epitaxial material with a dielectric material.

Aspects of the present disclosure further provide a method for fabricating a 3D semiconductor structure. For example, the method can include forming over a substrate a multilayer stack that includes a plurality of layers, first and second portions of one of the layers having different first and second thicknesses, respectively, forming a first opening through a first portion of the multilayer stack that includes the first portion of the layer until uncovering a top surface of the substrate, forming in the first opening a first VFET over the substrate, the first VFET including a first channel having a first length corresponding to the first thickness of the first portion of the layer, forming a second opening through a second portion of the multilayer stack that includes the second portion of the layer until uncovering the top surface of the substrate, and forming in the second opening a second VFET over the substrate, the second VFET including a second channel having a second length corresponding to the second thickness of the second portion of the layer.

In an embodiment, the first and second openings can have different sizes and/or shapes. In another embodiment, the layer of the multilayer stack can be a metal layer.

Aspects of the present disclosure can also provide a 3D semiconductor structure. For example, the 3D semiconductor structure can include a first VFET including a first channel having a first length, and a second VFET including a second channel having a second length different from the first length. The first and second VEFTs can be stacked vertically or disposed horizontally.

In an embodiment, the first and second VFETs can be disposed horizontally and have different sizes and/or shapes. In another embodiment, the 3D semiconductor structure can further include a third VFET including a third channel having a third length, the second VFET can be vertically stacked over the first VFET, the first and third VFETs can be disposed horizontally, and the third length can be different from the first length.

Note that this summary section does not specify every embodiment and/or incrementally novel aspect of the present disclosure or claimed disclosure. Instead, this summary only provides a preliminary discussion of different embodiments and corresponding points of novelty. For additional details and/or possible perspectives of the disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION

Figure 1:
FIGS. 1-9 are cross-sectional views illustrating an exemplary method for fabricating a 3D semiconductor structure that includes a plurality of 3D semiconductor devices with different channel lengths according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Techniques herein can enable higher density circuits to be produced at reduced cost. In an embodiment, multiple metal pre-wiring connections, e.g., a multilayer stack of metal and dielectric layers, are provided prior to transistor formation within each different column or opening, which can be aligned to metal or offset to metal lines for source/drain (S/D) and gate regions.

FIGS. 1-9 are cross-sectional views illustrating an exemplary method for fabricating a 3D semiconductor structure 10 that includes a plurality of 3D semiconductor devices with different channel lengths according to some embodiments of the present disclosure. In an embodiment, the semiconductor structure 10 can include at least two (N>=2) vertical field-effect transistors (VFETs) in height and at least two (N>=2) VEFTs in width. As shown in FIG. 1, a substrate 100, such as a Si or SiGe substrate, can be provided, and a bottom dielectric layer 151, a first lower metal layer 111, a first lower dielectric layer 101 and a first middle metal layer 112 can be formed on the substrate 100 sequentially. The first lower metal layer 111 can be used to form a source/drain (S/D), e.g., a source, of a first VFET. The first middle metal layer 112 can be used to form a gate of the first VFET and have a first thickness d1, i.e., a channel length or a gate length of the first VFET.

Figure 2:
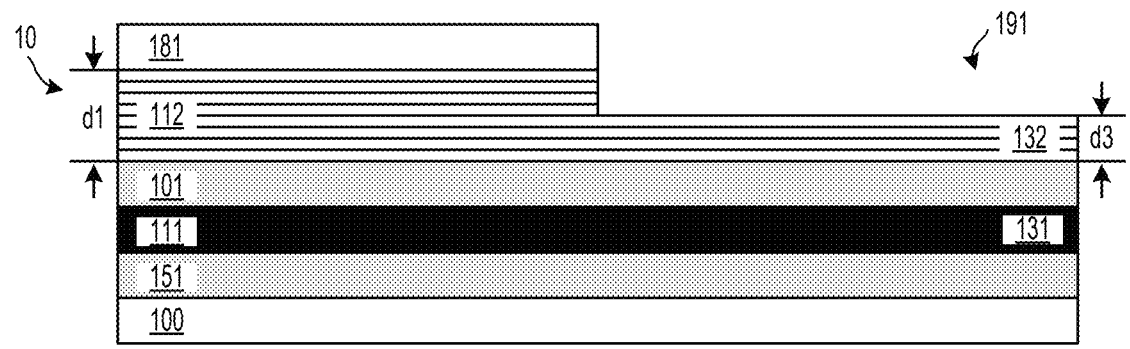

As shown in FIG. 2, a photoresist (PR) mask 181 can be patterned by photolithograph, for example, and formed to cover a portion (e.g., the left portion) of the first middle metal layer 112, and the rest (e.g., the right portion) of the first middle metal layer 112 that is not covered by the PR mask 181 can be etched downward to form an opening 191, until the right portion of the first middle metal layer 112 (hereinafter referred to as "third middle metal layer 132")

has a third thickness d3, i.e., a channel length or a gate length of a third VFET, which is different from the first thickness d1. The third middle metal layer 132 can be used to form a gate of the third VFET. A portion (e.g., the right portion) of the first lower metal layer 111 that corresponds to the third middle metal layer 132 (hereinafter referred to as "third lower metal layer 131") can be used to form an S/D, e.g., a source, of the third VFET.

Figure 3:
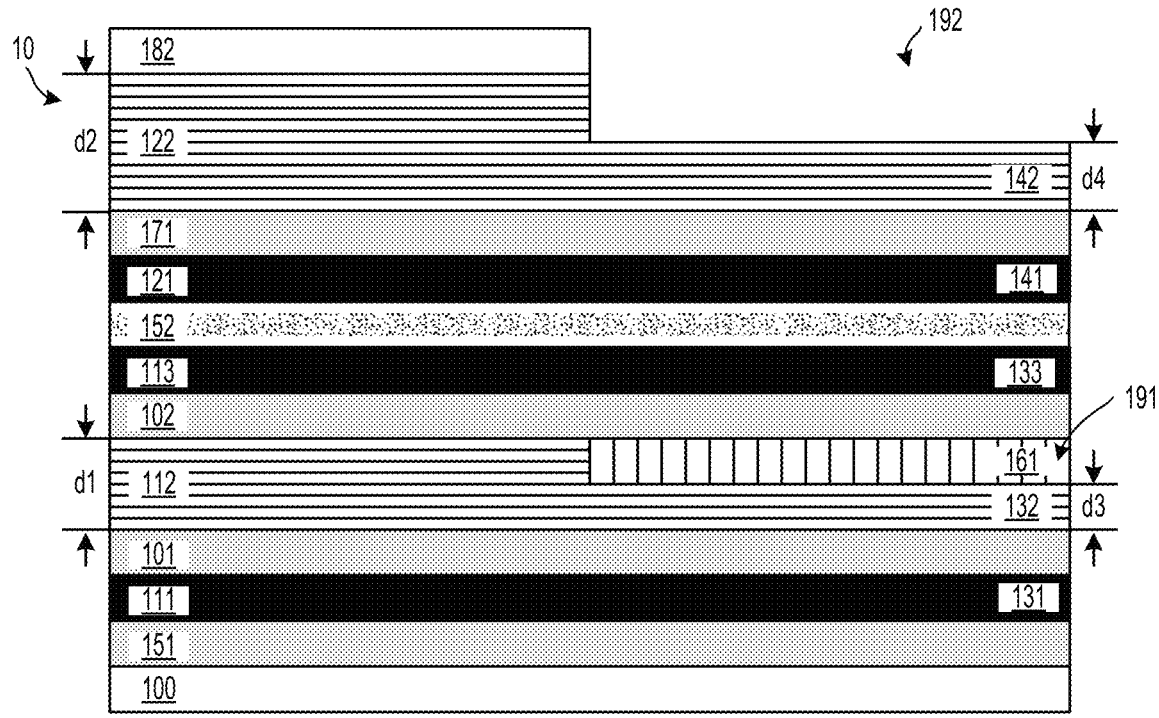

As shown in FIG. 3, the PR mask 181 (which is shown in FIG. 2) can be removed, and a third middle dielectric layer 161 can be deposited to fill the opening 191 and planarized using chemical-mechanical polishing (CMP), for example. A first upper dielectric layer 102 can be formed on the left portion of the first middle metal layer 112 and the third middle dielectric layer 161. A first upper metal layer 113, a top dielectric layer 152, a second lower metal layer 121, a second lower dielectric layer 171 and a second middle metal layer 122 can be formed on the first upper metal layer 113 sequentially. The first upper metal layer 113 can be used to form an S/D, e.g., a drain, of the first VFET. A portion (e.g., the right portion) of the first upper metal layer 113 that corresponds to the third middle metal layer 132 (hereinafter referred to as "third upper metal layer 133") can be used to form an S/D, e.g., a drain, of the third VFET. The second lower metal layer 121 can be used to form an S/D, e.g., a source, of a second VFET. The second middle metal layer 122 can be used to form a gate of the second VFET, and have a second thickness d2, i.e., a channel length of the second VFET, which can be different from the first thickness d1 and/or the third thickness d3.

Also shown in FIG. 3, a PR mask 182 can be patterned by photolithograph, for example, and formed on a portion (e.g., the left portion) of the second middle metal layer 122, and the rest (e.g., the right portion) of the second middle metal layer 122 that is not covered by the PR mask 182 can be etched downward to form an opening 192, until the right portion of the second middle metal layer 122 (hereinafter referred to as "fourth middle metal layer 142") has a fourth thickness d4, i.e., a channel length of a fourth VFET, which is different from the first thickness d1, the second thickness d2 and/or the third thickness d3. The fourth middle metal layer 142 can be used to form a gate of the fourth VFET. A portion (e.g., the right portion) of the second lower metal layer 121 that corresponds to the fourth middle metal layer 142 (hereinafter referred to as "fourth lower metal layer 141") can be used to form an S/D, e.g., a source, of the fourth VFET.

Figure 4:
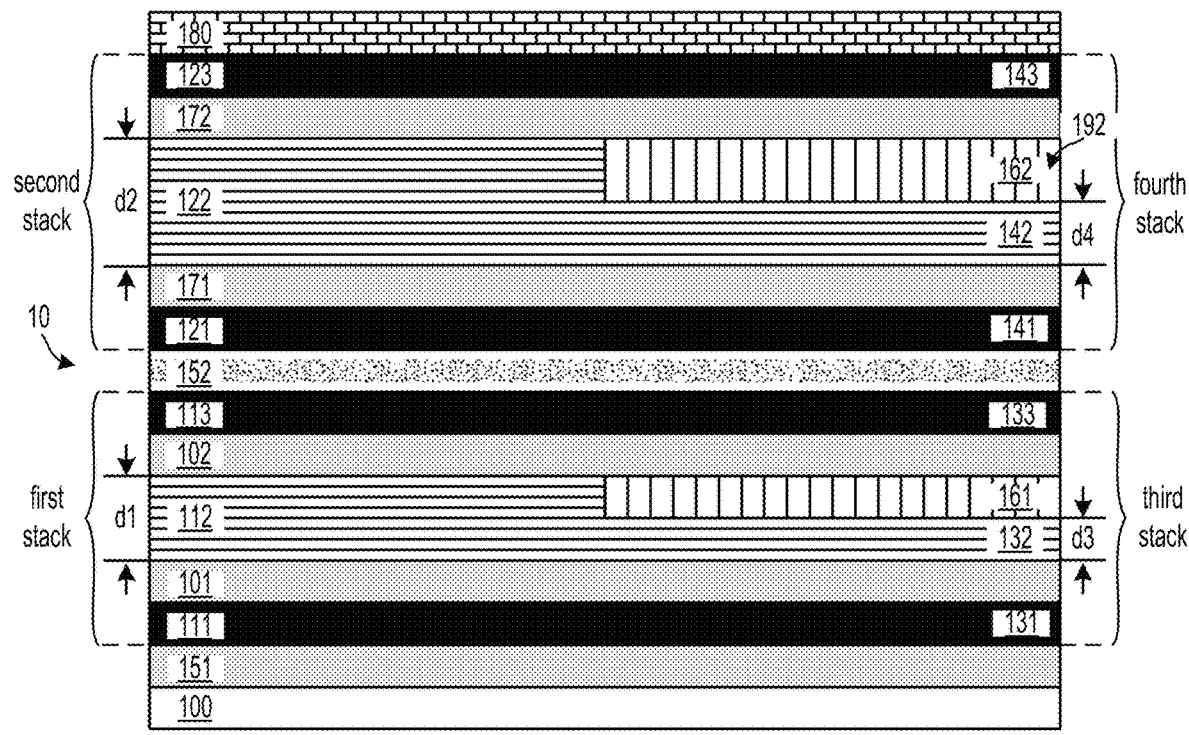

As shown in FIG. 4, the PR mask 182 (which is shown in FIG. 3) can be removed, and a fourth middle dielectric layer 162 can be deposited to fill the opening 192 and planarized using CMP, for example. A second upper dielectric layer 172 can be formed on the left portion of the second middle metal layer 122 and the fourth middle dielectric layer 162. A second upper metal layer 123 and a cap layer 180 can be formed on the second upper metal layer 123 sequentially. The second upper metal layer 123 can be used to form an S/D, e.g., a drain, of the second VFET. A portion (e.g., the right portion) of the second upper metal layer 123 that corresponds to the fourth middle metal layer 142 (hereinafter referred to as "fourth upper metal layer 143") can be used to form an S/D, e.g., a drain, of the fourth VFET.

The first lower metal layer 111, the first lower dielectric layer 101, the first middle metal layer 112, the first upper dielectric layer 102 and the first upper metal layer 113 can be collectively referred to as a first (multilayer) stack (of dielectric and metal layers). The second lower metal layer 121, the second lower dielectric layer 171, the second middle metal layer 122, the second upper dielectric layer 172 and the second upper metal layer 123 can be collectively referred to as a second (multilayer) stack (of dielectric and metal layers). The first lower metal layer 131, the first lower dielectric layer 101, the third middle metal layer 132, the third middle dielectric layer 161, the first upper dielectric layer 102 and the third upper metal layer 133 can be collectively referred to as a third (multilayer) stack (of dielectric and metal layers). The fourth lower metal layer 141, the second lower dielectric layer 171, the fourth middle metal layer 142, the fourth middle dielectric layer 162, the second upper dielectric layer 172 and the fourth upper metal layer 143 can be collectively referred to as a fourth (multilayer) stack (of dielectric and metal layers). The first and third stacks use the same parallel metal layers for both the different adjacent first and third VFETs for their S/Ds and gates. The second and fourth stacks use the same parallel metal layers for both the different adjacent second and fourth VFETs for their S/Ds and gates.

Figure 5:
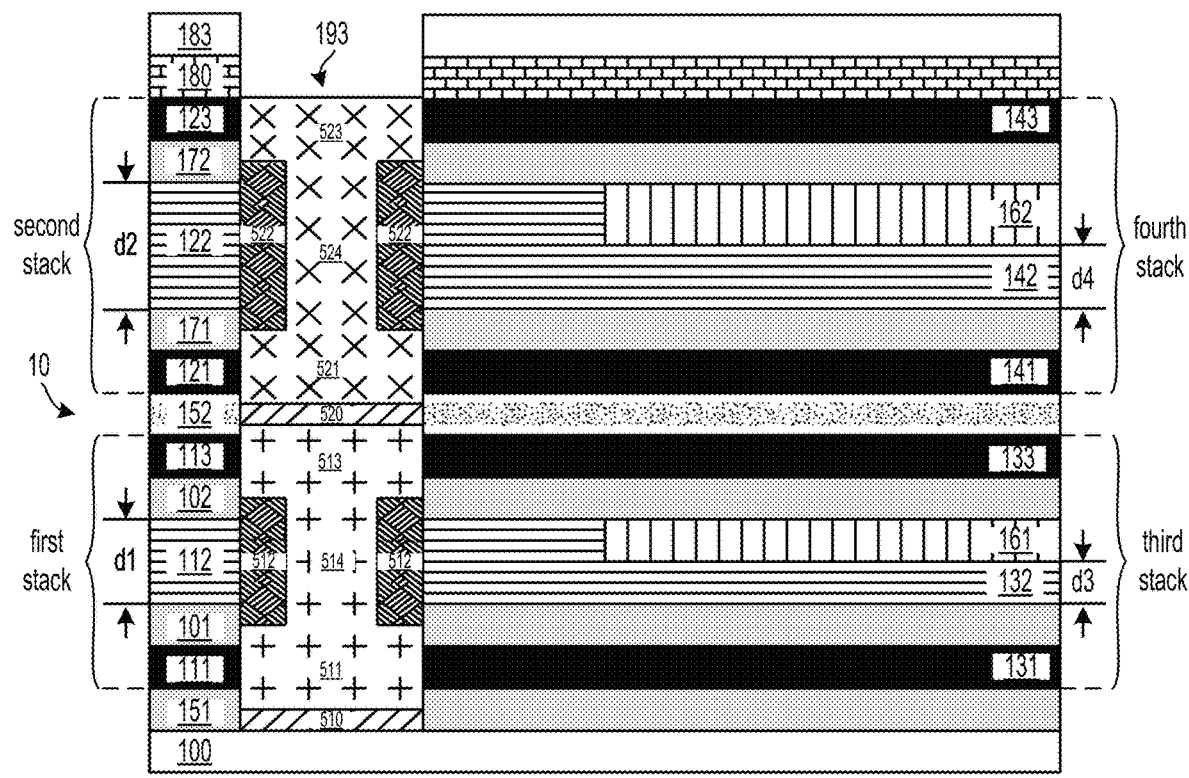

As shown in FIG. 5, a PR mask 183 can be patterned by photolithograph, for example, and formed to cover a portion (e.g., the left portion) of the cap layer 180 over the entire fourth and third stacks and a portion of the second and first stacks, and the rest (e.g., the right portion) of the second and first stacks that is not covered by the PR mask 183 can be etched downward through the second stack, the top dielectric layer 152, the first stack and the bottom dielectric layer 151 until uncovering the top surface of the substrate 100, to form a left opening 193. The PR mask 183 can then be removed. The left opening 193 allows the first VFET and the second VFET to be formed therein sequentially.

For example, a first (sacrificial) epitaxial material 510 can be formed (e.g., epitaxially grown) on the substrate 100. The first epitaxial material 510 can be aligned with the bottom dielectric layer 151 or cover a portion of a vertical sidewall of the bottom dielectric layer 151. The first epitaxial material 510 can be, for example, Si or SiGe, among others.

A first source region 511 of the first VFET can be formed (e.g., epitaxially grown) on the first epitaxial material 510 with a first type channel material, e.g., a P type epitaxial material. The first source region 511 can cover a vertical sidewall of the first lower metal layer 111 of the first stack or further cover a portion of the vertical sidewall of the bottom dielectric layer 151 and/or a portion of a vertical sidewall of the first lower dielectric layer 101, which is between the first lower metal layer 111 and the first middle metal layer 112.

A first gate region 512 can be formed (e.g., deposited) on the first source region 511 with a first gate material, e.g., a first high-k material. In an embodiment, the first gate region 512 can cover vertical sidewalls of the first middle metal layer 112 to the second upper metal layer 123. The P type epitaxial material growth can be continued until being aligned with or higher than the first middle metal layer 112 (e.g., covering a portion of the first upper dielectric layer 102). A portion of the first high-k material 512 that is higher than the continuously grown P type epitaxial material (i.e., higher than the first middle metal layer 122 or the portion of the first upper dielectric layer 102) can then be removed (e.g., via etching). The first gate region 512 thus formed can cover the vertical sidewall of the first middle metal layer 122. In an embodiment, the first gate region 512 can further cover a portion of the first lower dielectric layer 101 and a portion of the first upper dielectric layer 102.

The P type epitaxial material growth can be continued until being aligned with the first gate region 512 to form a first channel 514 of the first VFET. The first channel 514 can thus have a first length corresponding to the first thickness d1 of the first middle metal layer 112.

The P type epitaxial material growth can be continued until being aligned with or higher than the first upper metal layer 113 (e.g., covering a portion of the top dielectric layer 152) to form a first drain region 513 of the first VFET. The first drain region 513 thus formed can cover the vertical sidewall of the first upper metal layer 113 or further cover a portion of the first upper dielectric layer 102 and a portion of the top dielectric layer 152.

Similarly, a second epitaxial (sacrificial, transitional) material 520 can be formed (e.g., epitaxially grown) on the first drain region 513; a second source region 521 of the second VFET can be formed (e.g., epitaxially grown) on the second epitaxial material 520 with a second type channel material, e.g., an N type epitaxial material, which is different from the first type channel material; a second gate region 522 of the second VFET can be formed (e.g., deposited) on the second source region 521 with a second gate material, e.g., a second high-k material, which can be the same as or different from the first high-k material, to cover the second middle metal layer 122; the N type epitaxial material growth can be continued until being aligned with the second gate region 522 to form a second channel 524 of the second VFET, the second channel 524 having a second length corresponding to the second thickness d2 of the second middle metal layer 122; and the N type epitaxial material growth can be continued until being aligned with the second upper metal layer 123 to form a second drain region 523 of the second VFET.

Therefore, a left vertical complementary field-effect transistor (CFET) with two different channel lengths, which correspond to the first thickness d1 and the second thickness d2, respectively, can be formed. The left vertical CFET can have the source spacers (e.g., the first lower dielectric layer 101 and the second lower dielectric layer 171) and drain spacers (e.g., the first upper dielectric layer 102 and the second upper dielectric layer 172) of the same or different thicknesses.

Figure 6:
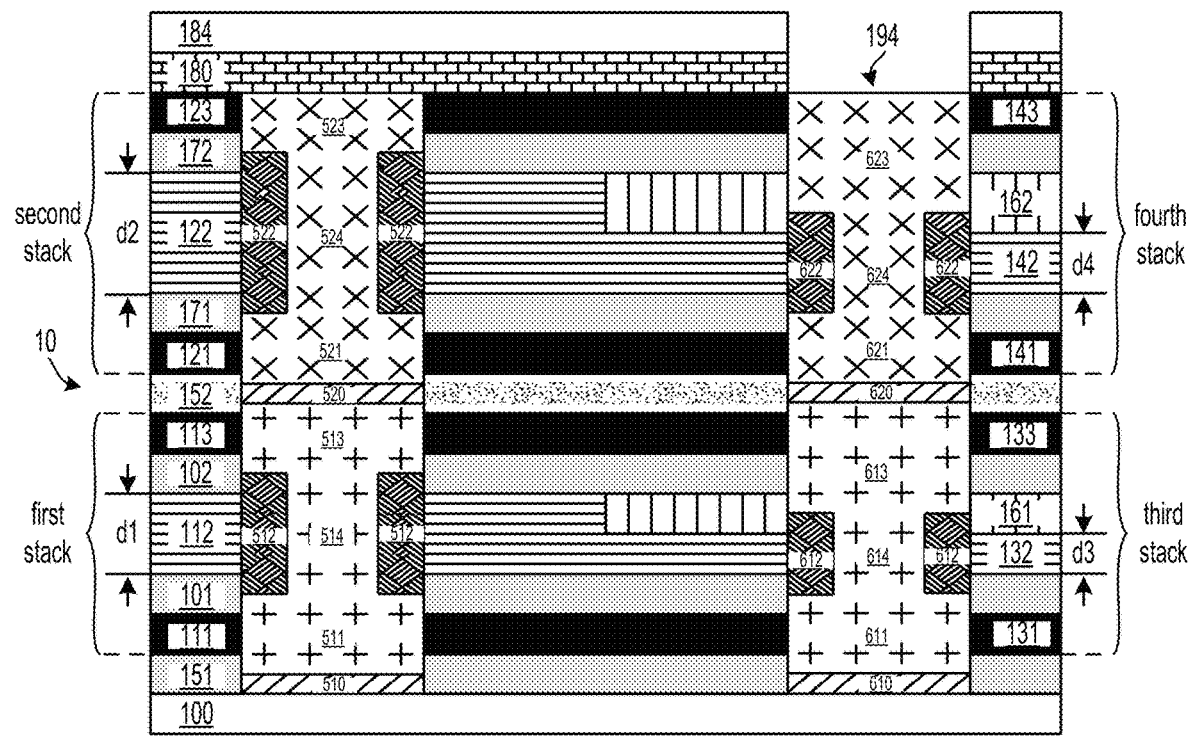

As shown in FIG. 6, the cap layer 180 can be deposited to cover the second drain region 523 of the second VFET of the left vertical CFET and planarized using CMP, for example. A PR mask 184 can be patterned by photolithograph, for example, and formed to cover a portion (e.g., the left portion) of the cap layer 180 over the entire second and first stacks and a portion of the fourth and third stacks, and the rest (e.g., the right portion) of the fourth and third stacks that is not covered by the PR mask 184 can be etched downward through the fourth stack, the top dielectric layer 152, the third stack and the bottom dielectric layer 151 until uncovering the top surface of the substrate 100, to form a right opening 194. The PR mask 184 can then be removed. The right opening 194 can be the same as or different from the left opening 193 in size and/or shape. The right opening 194 allows the third VFET and the fourth VFET to be formed therein sequentially.

For example, a third epitaxial (sacrificial) material 610 can be formed (e.g., epitaxially grown) on the substrate 100; a third source region 611 of the third VFET can be formed (e.g., epitaxially grown) on the third epitaxial material 610 with the first type channel material, e.g., the P type epitaxial material (or with the second type channel material, e.g., the N type epitaxial material); a third gate region 612 of the third VFET can be formed (e.g., deposited) on the third source region 611 with a third gate material, e.g., a third high-k material, which can be the same as or different from the first high-k material and/or the second high-k materials; the P type epitaxial material growth can be continued until being aligned with the third gate region 612 to form a third channel 614 of the third VFET, the third channel 614 having a third length corresponding to the third thickness d3 of the third middle metal layer 132 of the third stack; the P type epitaxial material growth can be continued until being aligned with the third upper metal layer 133 to form a third drain region 613 of the third VFET; a fourth epitaxial (sacrificial, transitional) material 620 can be formed (e.g., epitaxially grown) on the third drain region 613; a fourth source region 621 of the fourth VFET can be formed (e.g., epitaxially grown) on the fourth epitaxial material 620 with the second type channel material, e.g., the N type epitaxial material (or with the first type channel material, e.g., the P type epitaxial material), which is different from the first type channel material; a fourth gate region 622 of the fourth VFET can be formed (e.g., deposited) on the fourth source region 621 with a fourth gate material, e.g., a fourth high-k material, which can be the same as or different from the first high-k material and/or the second high-k material and/or the third high-k materials; the N type epitaxial material growth can be continued until being aligned with the fourth gate region 622 to form a fourth channel 624 of the fourth VFET, the fourth channel 624 having a fourth length corresponding to the fourth thickness d4 of the fourth middle metal layer 142 of the fourth stack; and the N type epitaxial material growth can be continued until being aligned with the fourth upper metal layer 143 to form a fourth drain region 623 of the fourth VFET. Therefore, a right vertical CFET also with two different channel lengths, which correspond to the third thickness d3 and the fourth thickness d4, respectively, can be formed.

Figure 7:
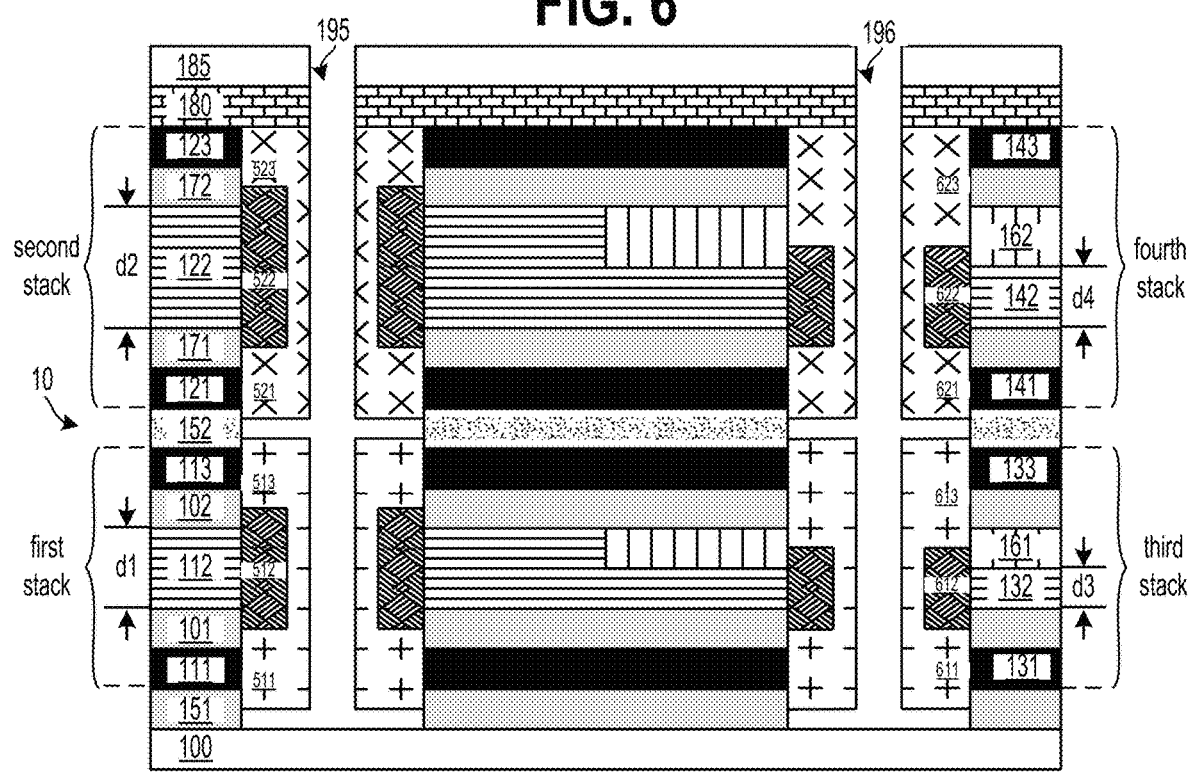

As shown in FIG. 7, the cap layer 180 can be deposited to cover the fourth drain region 623 of the fourth VFET of the right vertical CFET and planarized using CMP, for example. A PR mask 185 can be patterned by photolithograph, for example, and formed to cover a portion of the cap layer 180 over a portion of the left vertical CFET and a portion of the right vertical CFET, and the rest of the left and right vertical CFETs that is not covered by the PR mask 185 can be etched downward until uncovering the top surface of the substrate 100, to form a left opening 195 and a right opening 196. The PR mask 185 can then be removed. The first, second, third and fourth epitaxial materials 510, 520, 610 and 620 can be removed.

Figure 8:
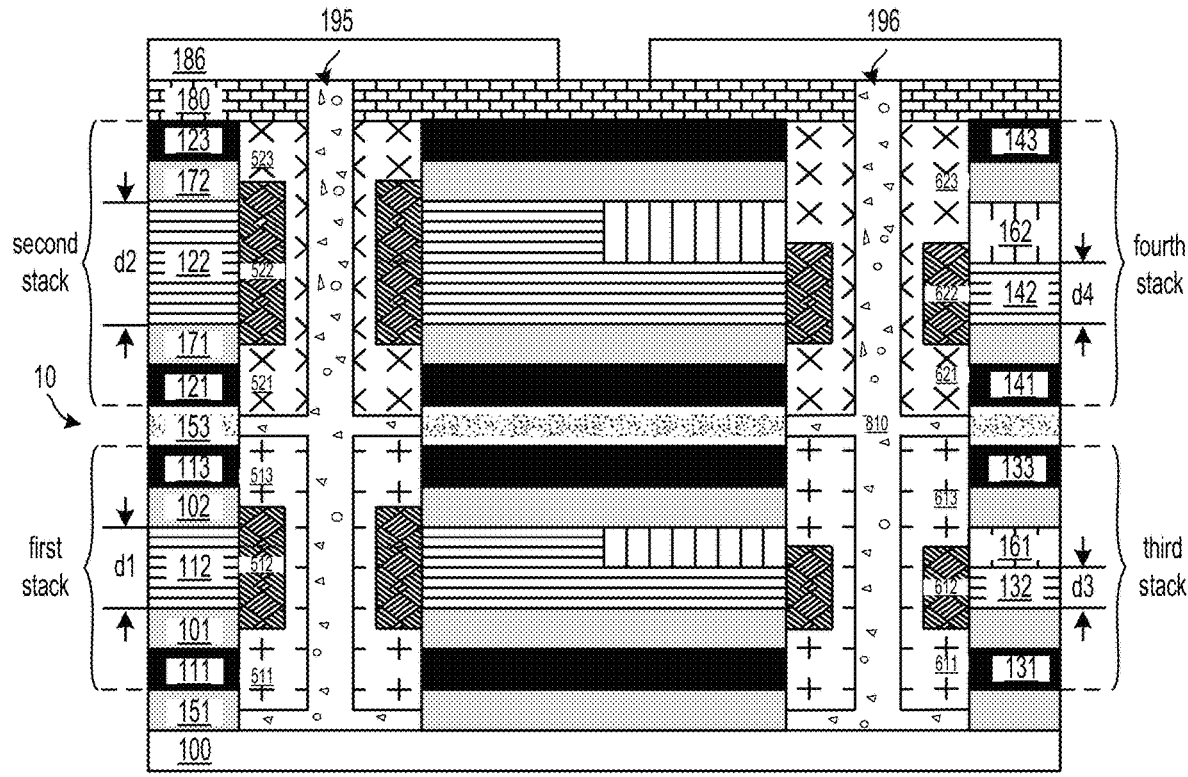

As shown in FIG. 8, a dielectric material 810 can be deposited to replace the removed first, second, third and fourth epitaxial materials 510, 520, 610 and 620 (which are shown in FIG. 7) and fill the left and right openings 195 and 196. A PR mask 186 can be patterned by photolithograph, for example, and formed to cover a portion of the cap layer 180 over the entire left and right vertical CFETs.

Figure 9:
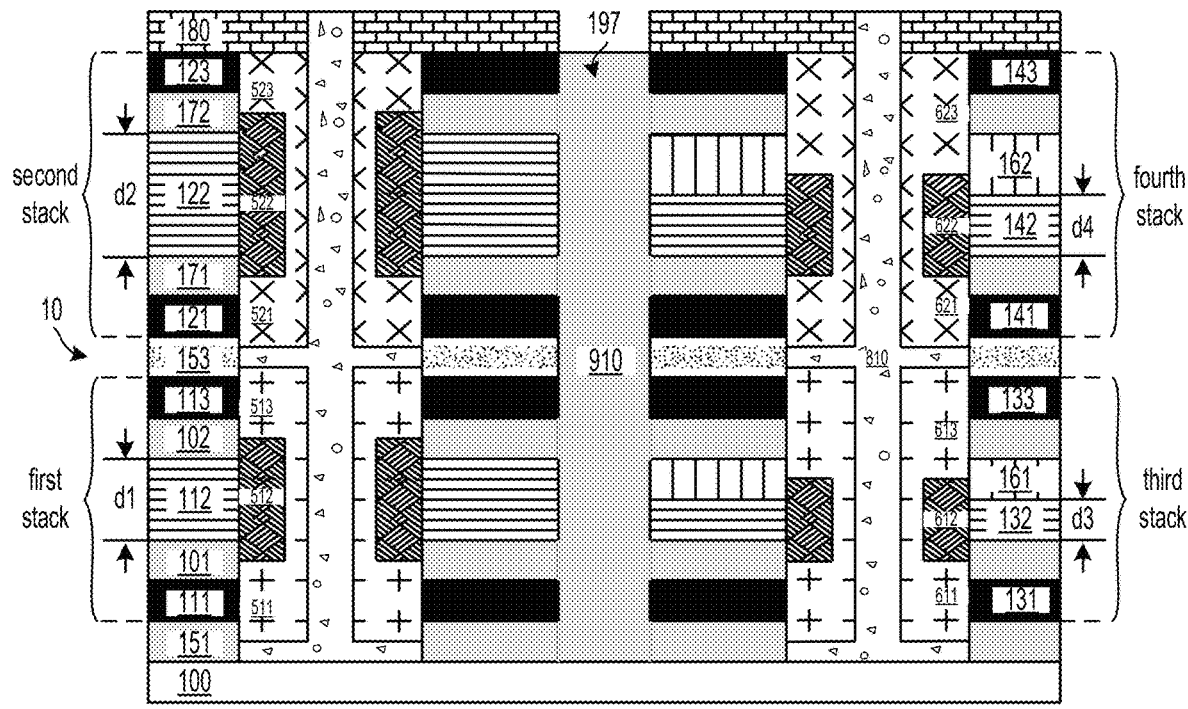

As shown in FIG. 9, the rest of the first to fourth stacks that is not covered by the PR mask 186 (which is shown in FIG. 8) can be etched downward until uncovering the top surface of the substrate 100, to form an opening 197. The PR mask 186 can then be removed. A dielectric material 910 can be deposited to fill the opening 197, and the cap layer 180 can be removed. Accordingly, the left and right vertical CFETs can be separated from each other.

Figure 9A:
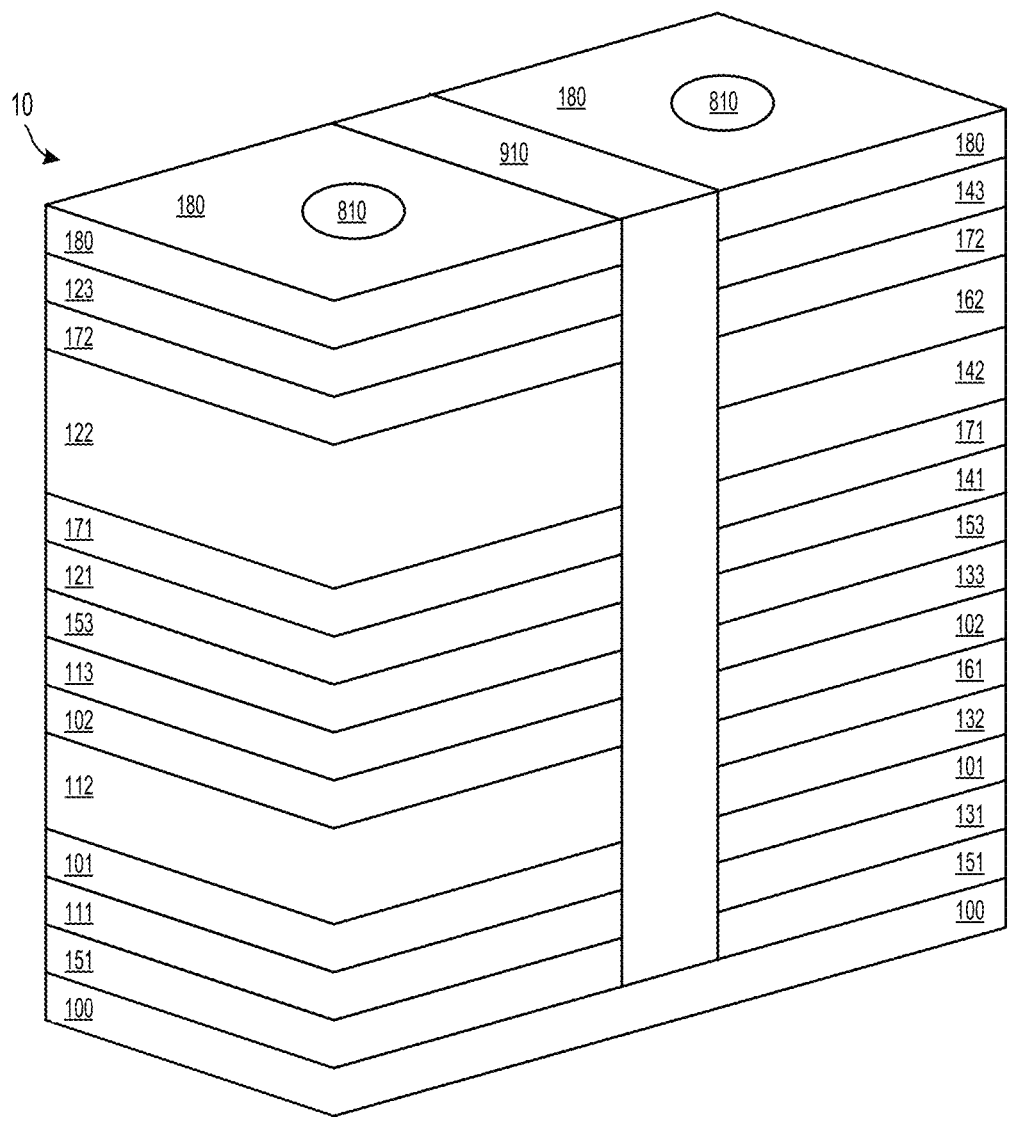
FIG. 9A is a schematic view of the 3D semiconductor structure shown in FIG. 9.

Therefore, the left vertical CFET and the right vertical CFET of the 3D semiconductor structure 10 thus formed can have four different channel lengths (or gate electrode lengths), and the right vertical CFET can have two different spacer lengths, both of which are different from the spacer lengths of the left vertical CFET. FIG. 9A is a schematic view of the 3D semiconductor structure 10 shown in FIG. 9.

In an embodiment, the method according to the present disclosure can form the first and third stacks, form the openings 193 and 194, and form the first and third VFETs in the openings 193 and 194, respectively. Therefore, the 3D semiconductor structure 10 can include the first and third VFETs that are disposed horizontally and have different channel lengths.

Figure 10:
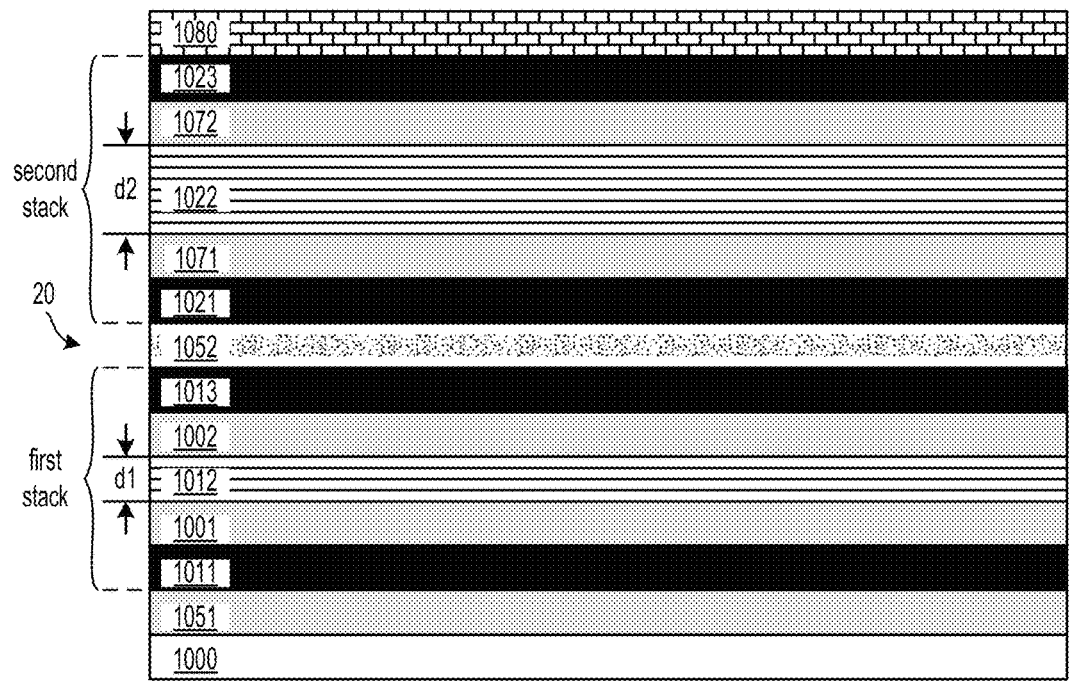
FIGS. 10-16 are cross-sectional views illustrating an exemplary method for fabricating a 3D semiconductor structure that includes a plurality of 3D semiconductor devices with different channel lengths according to some embodiments of the present disclosure.

FIGS. 10-16 are cross-sectional views illustrating an exemplary method for fabricating a 3D semiconductor structure 20 that includes a plurality of 3D semiconductor devices with different channel lengths according to some embodiments of the present disclosure. In an embodiment, the semiconductor structure 20 can include at least two (N>=2) VFETs in width (e.g., a left VFET and a right VFET) and the left and right VFETs can include at least two (N>=2) vertically stacked VFETs and at least one (N>=1) VFET, respectively. As shown in FIG. 10, a substrate 1000 can be provided, and a plurality of (multilayer) stacks of dielectric and metal layers can be formed on the substrate 1000. For example, a bottom dielectric layer 1051, a first (multilayer) stack that includes a first lower metal layer 1011, a first lower dielectric layer 1001, a first middle metal layer 1012, a first upper dielectric layer 1002 and a first upper metal layer 1013, a top dielectric layer 1052, a second (multilayer) stack that includes a second lower metal layer 1021, a second lower dielectric layer 1071, a second middle metal layer 1022, a second upper dielectric layer 1072 and a second upper metal layer 1023, and a cap layer 1080 can be formed on the substrate 1000 sequentially. The first lower metal layer 1011 can be used to form an S/D, e.g., a source, of a first VFET. The first middle metal layer 1012 can be used to form a gate of the first VFET, and have a first thickness d1, i.e., a channel length or a gate length of the first VFET. The first upper metal layer 1013 can be used to form an S/D, e.g., a drain, of the first VFET. The second lower metal layer 1021 can be used to form an S/D, e.g., a source, of a second VFET. The second middle metal layer 1022 can be used to form a gate of the second VFET, and have a second thickness d2, i.e., a channel length or a gate length of the second VFET, which can be different from the first thickness d1. The second upper metal layer 1023 can be used to form an S/D, e.g., a drain, of the second VFET.

Figure 11:
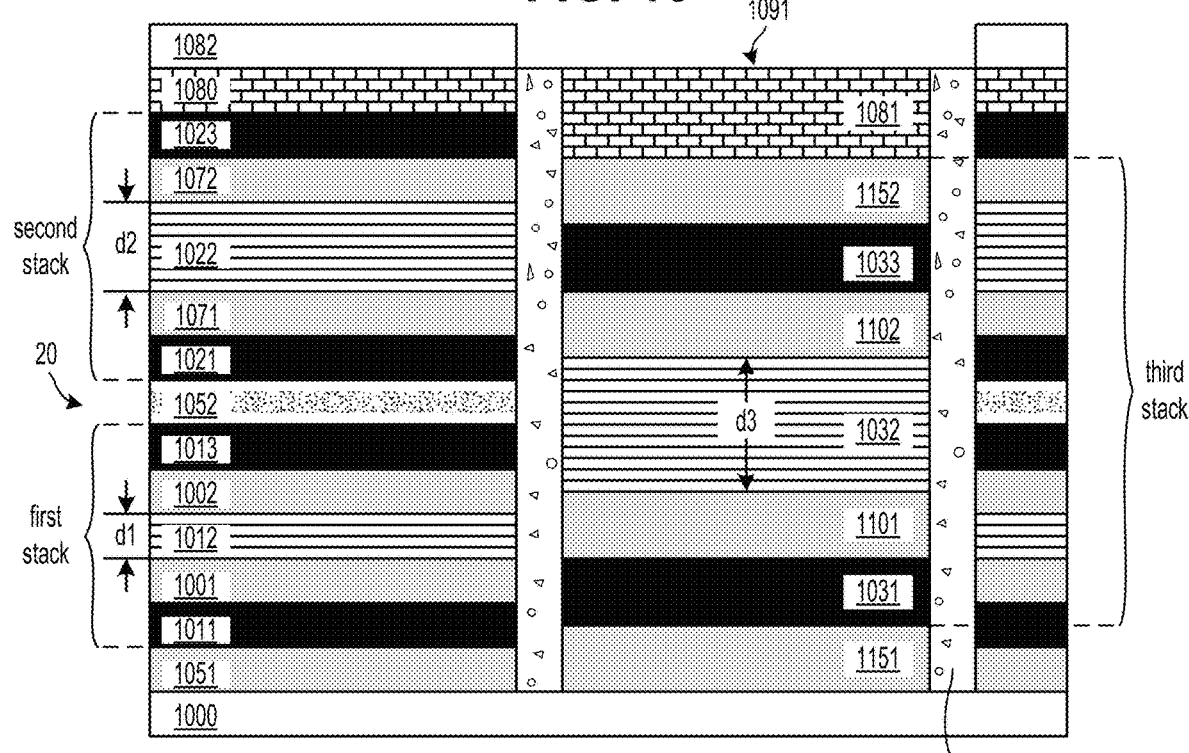

As shown in FIG. 11, a PR mask 1082 can be patterned by photolithograph, for example, and formed to cover a portion (e.g., the left portion) of the cap layer 1080, and the rest (e.g., the right portion) of the cap layer 1080 that is not covered by the PR mask 1082 can be etched downward until uncovering the top surface of the substrate 1000, to form an opening 1091. The PR mask 1082 can be removed, and a liner 1190, e.g., a dielectric layer, can be formed, by depositing and etching, to cover sidewalls of the cap layer 1080, the second stack, the top dielectric layer 1052, the first stack and the bottom dielectric layer 1051 within the opening 1091 and isolate the metal layers of the first and second stacks, i.e., the first lower metal layer 1011, the first middle metal layer 1012, the first upper metal layer 1013, the second lower metal layer 1021, the second middle metal layer 1022 and the second upper metal layer 1023, from future adjacent 3D vertical stack. A third stack of dielectric and metal layers can be formed to fill the opening 1091. For example, a bottom dielectric layer 1151, a third stack that includes a third lower metal layer 1031, a third lower dielectric layer 1101, a third middle metal layer 1032, a third upper dielectric layer 1102 and a third upper metal layer 1033, a top dielectric layer 1152 and a cap layer 1081 can be formed on the substrate 1000 within the opening 1091 sequentially. The third lower metal layer 1031 can be used to form an S/D, e.g., a source, of a third VFET, e.g., a higher voltage (HV) third VFET. The third middle metal layer 1032 can be used to form a gate of the third VFET, and have a third thickness d3, i.e., a channel length or a gate length of the third VFET, which can be different from the first thickness d1 and/or the second thickness d2. The third upper metal layer 1033 can be used to form an S/D, e.g., a drain, of the third VFET. The third lower dielectric layer (e.g., a source spacer) 1101 and the third upper dielectric layer (e.g., a drain spacer) 1102 can be thicker than the first lower dielectric layer 1001, the first upper dielectric layer 1002, the second lower dielectric layer 1071 and the second upper dielectric layer 1072. Therefore, higher voltages can be allowed on the gate and also the source or drain of the HV third VFET.

Figure 12:
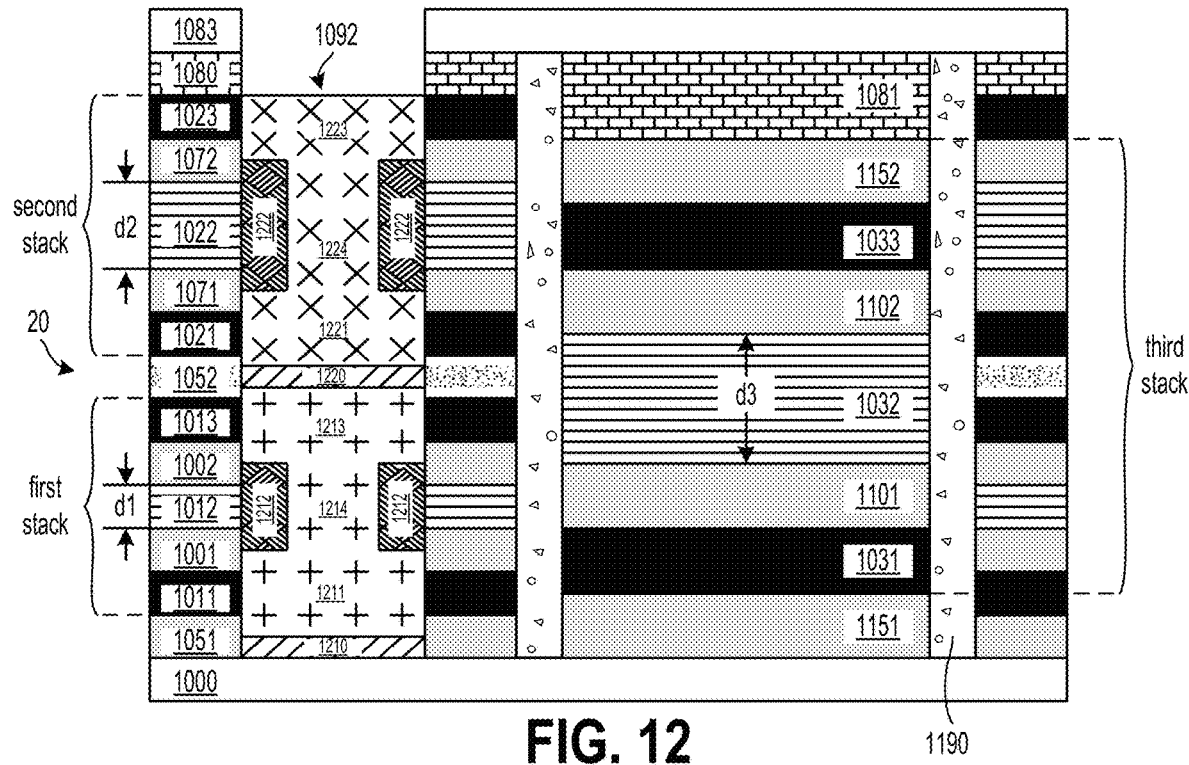

As shown in FIG. 12, a PR mask 1083 can be patterned by photolithograph, for example, and formed to cover a portion of the cap layer 1080 and the entire cap layer 1081 and liner 1190, and the rest of the first and second stacks that is not covered by the PR mask 1083 can be etched downward through the second stack, the top dielectric layer 1052, the first stack and the bottom dielectric layer 1051 until uncovering the top surface of the substrate 1000, to form an opening 1092. The PR mask 1083 can then be removed. The opening 1092 allows the first VFET and the second VFET to be formed therein sequentially.

For example, a first (sacrificial) epitaxial material 1210 can be formed (e.g., epitaxially grown) on the substrate 1000; a first source region 1211 of the first VFET can be formed (e.g., epitaxially grown) on the first epitaxial material 1210 with the first type channel material, e.g., the P type epitaxial material (or with the second type channel material, e.g., the N type epitaxial material); a first gate region 1212 of the first VFET can be formed (e.g., deposited) on the first source region 1211 with a first gate material, e.g., a first high-k material; the P type epitaxial material growth can be continued until being aligned with the first gate region 1212 to form a first channel 1214 of the first VFET, the first channel 1214 having a first length corresponding to the first thickness d1 of the first middle metal layer 1012; the P type epitaxial material growth can be continued until being aligned with the first upper metal layer 1013 to form a first drain region 1213 of the first VFET; a second epitaxial (sacrificial, transitional) material 1220 can be formed (e.g., epitaxially grown) on the first drain region 1213; a second source region 1221 of the second VFET can be formed (e.g., epitaxially grown) on the second epitaxial material 1220 with the second type channel material, e.g., the N type epitaxial material (or with the first type channel material, e.g., the P type epitaxial material), which is different from the first type channel material; a second gate region 1222 of the second VFET can be formed (e.g., deposited) on the second source region 1221 with a second gate material, e.g., a second high-k material, which can be the same as or different from the first high-k materials; the N type epitaxial material growth can be continued until being aligned with the second gate region 1222 to form a second channel 1224 of the second VFET, the second channel 1224 having a second length corresponding to the second thickness d2 of the second middle metal layer 1022; and the N type epitaxial material growth can be continued until being aligned with the second upper metal layer 1023 to form a second drain region 1223 of the second VFET. Therefore, a left vertical CFET with two different channel lengths, which correspond to the first thickness d1 and the second thickness d2, respectively, can be formed.

Figure 13:
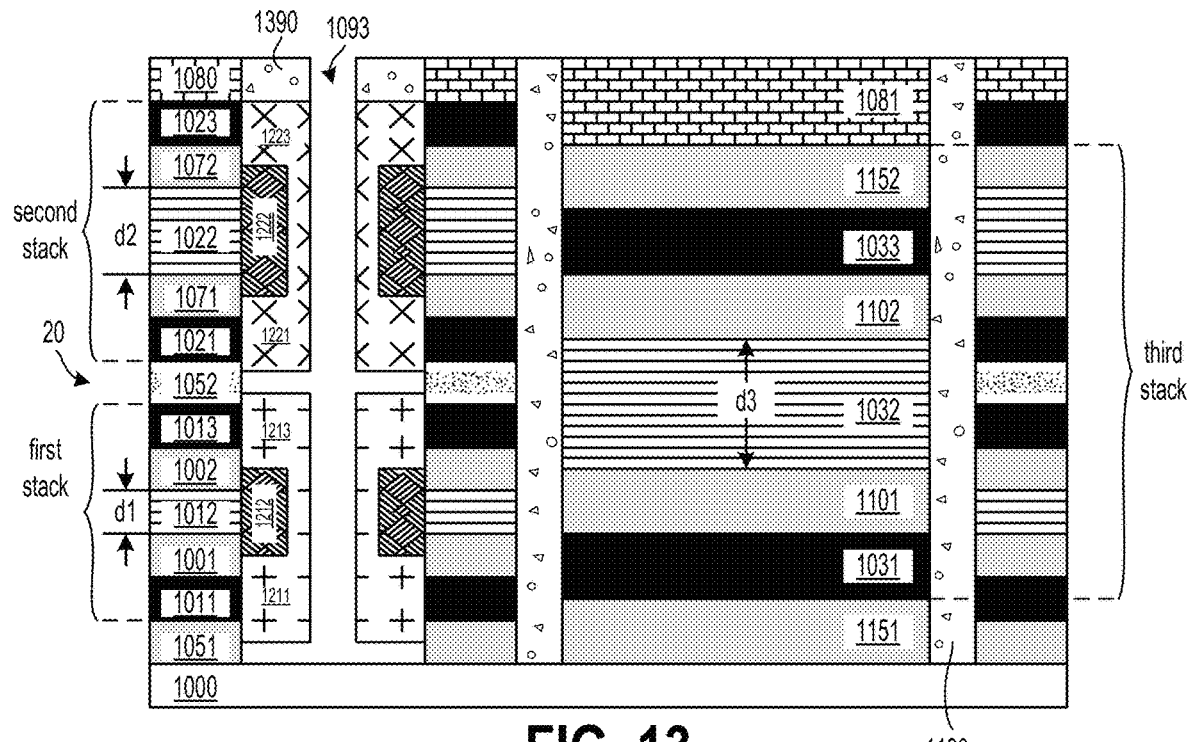

As shown in FIG. 13, a dielectric layer 1390 can be deposited on a portion of the left vertical CFET, and the rest of the left vertical CFET that is not covered by the dielectric layer 1390 can be etched downward until uncovering the top surface of the substrate 1000, to form an opening 1093. The first and second epitaxial materials 1210 and 1220 (which are shown in FIG. 12) can then be removed.

Figure 14:
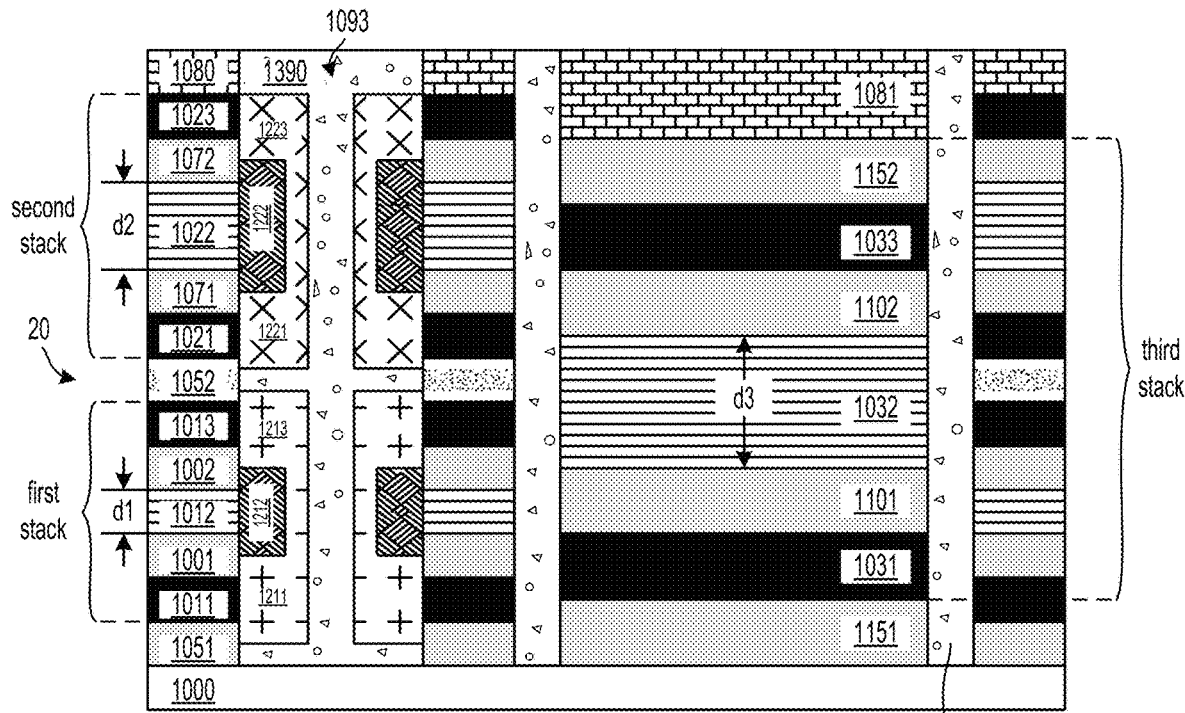

As shown in FIG. 14, the dielectric material 1390 can be deposited to replace the removed first and second epitaxial materials 1210 and 1220 and fill the opening 1093.

Figure 15:
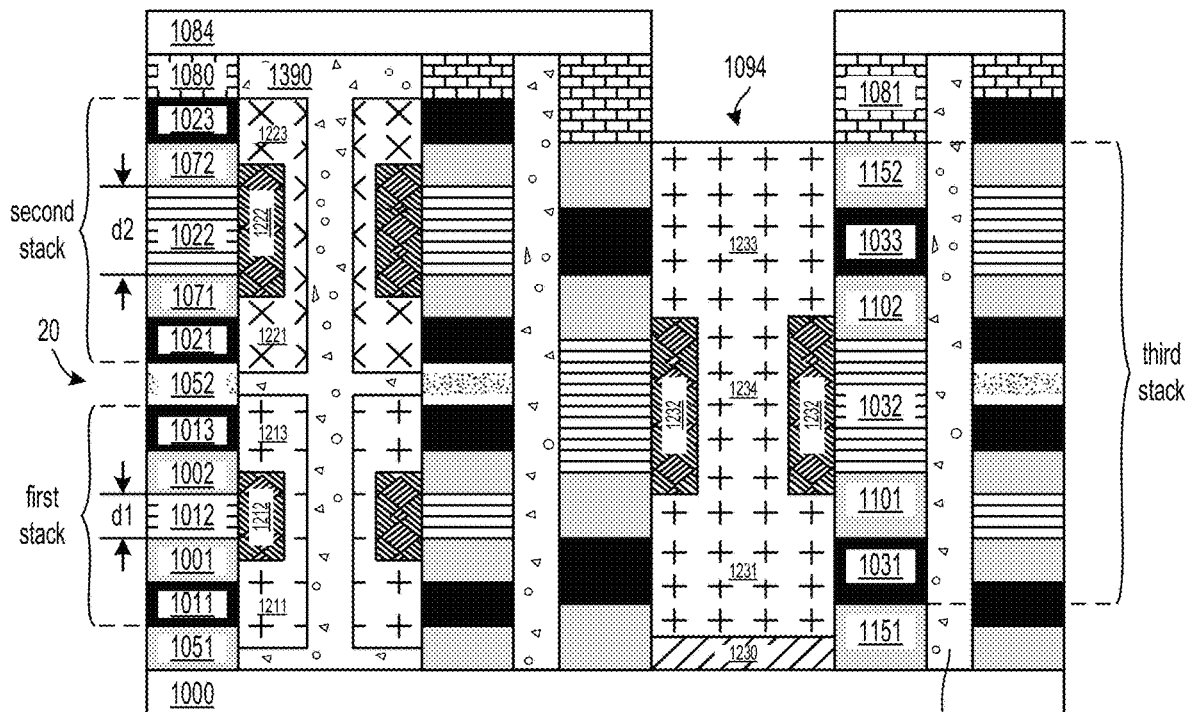

As shown in FIG. 15, a PR mask 1084 can be patterned by photolithograph, for example, and formed to cover the entire left vertical CFET and liner 1190 and a portion of the third stack, and the rest of the third stack that is not covered by the PR mask 1084 can be etched downward until uncovering the top surface of the substrate 1000, to form an opening 1094. The PR mask 1084 can then be removed. The opening 1094 allows the third VFET to be formed therein.

For example, a third (sacrificial) epitaxial material 1230 can be formed (e.g., epitaxially grown) on the substrate 1000; a third source region 1231 of the third VFET can be formed (e.g., epitaxially grown) on the third epitaxial material 1230 with the first type channel material, e.g., the P type epitaxial material (or with the second type channel material, e.g., the N type epitaxial material); a third gate region 1232 of the third VFET can be formed (e.g., deposited) on the third source region 1231 with a third gate material, e.g., a third high-k material; the P type epitaxial material growth can be continued until being aligned with the third gate region 1232 to form a third channel 1234 of the third VFET, the third channel 1234 having a third length corresponding to the third thickness d3 of the third middle metal layer 1032; and the P type epitaxial material growth can be continued until being aligned with the third upper metal layer 1033 or with the top dielectric layer 1152 to form a third drain region 1233 of the third VFET. Therefore, the third VFET with different channel length, which corresponds to the third thickness d3, from the first and second VFETs of the left vertical CFET can be formed.

Figure 16:
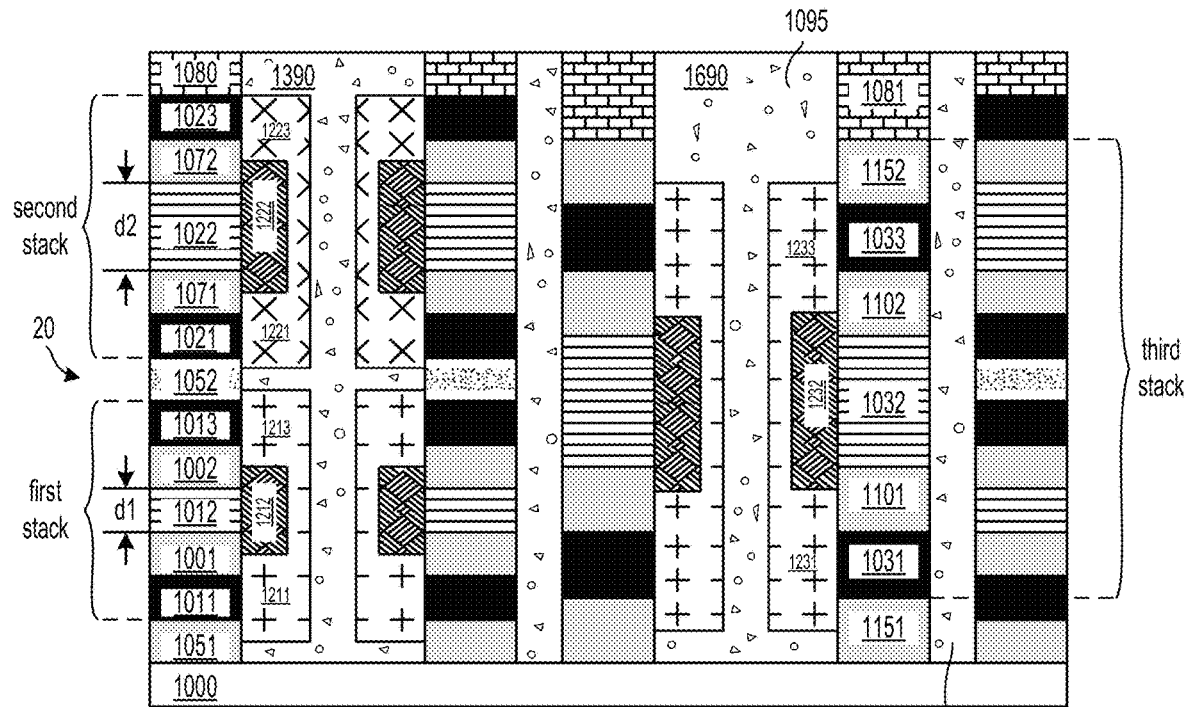

As shown in FIG. 16, which illustrates similar processes to those shown in FIGS. 13 and 14, a dielectric layer 1690 can be deposited on a portion of the third VFET, the rest of the third VFET that is not covered by the dielectric layer 1690 can be etched downward until uncovering the top surface of the substrate 1000, to form an opening 1095, the third epitaxial material 1230 (which is shown in FIG. 15) can be removed, and the dielectric material 1690 can be deposited to replace the removed third epitaxial materials 1230 and fill the opening 1095.

Figure 16A:
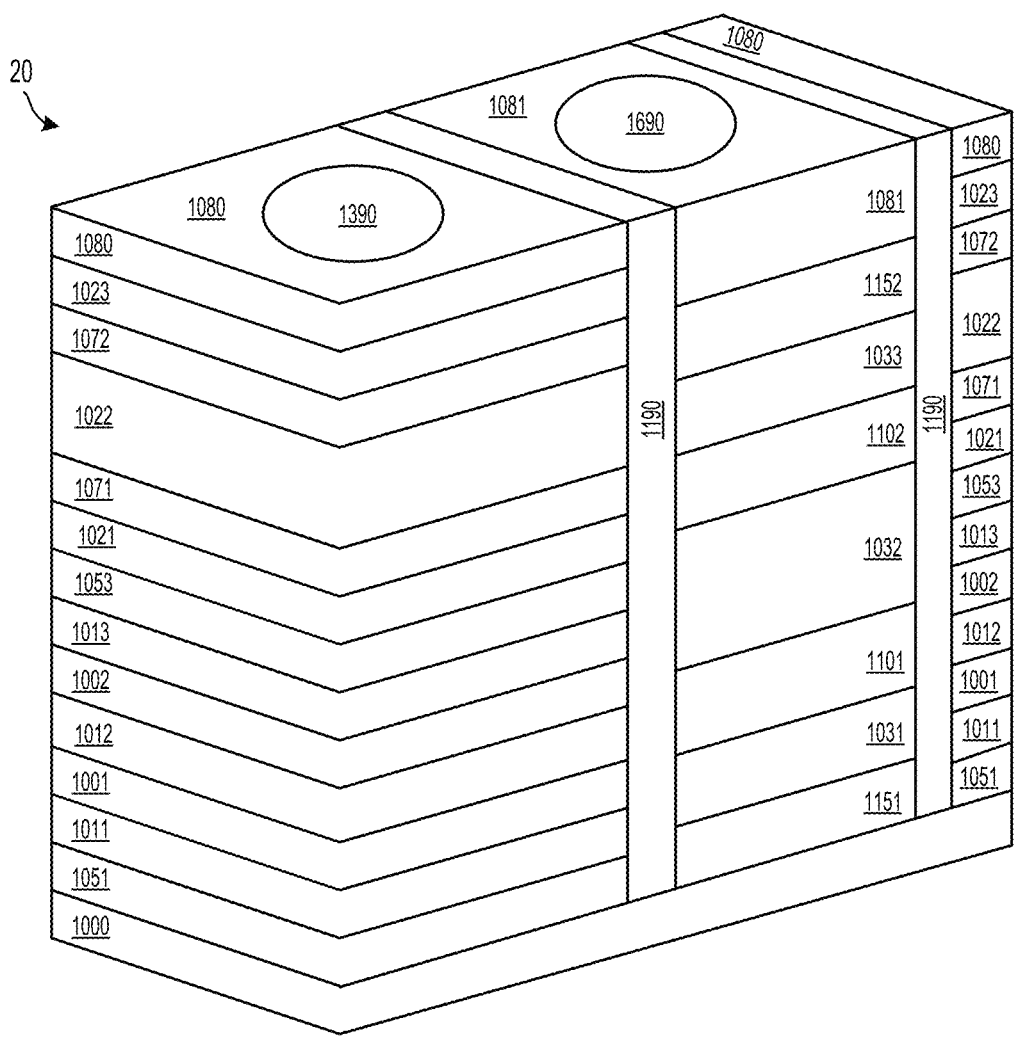
FIG. 16A is a schematic view of the 3D semiconductor structure shown in FIG. 16.

Therefore, the left vertical CFET and the right VFET of the 3D semiconductor structure 20 thus formed can have three different channel lengths (or gate electrode lengths), and the right VFET can have two different spacer lengths, both of which are different from the spacer lengths of the left vertical CFET. FIG. 16A is a schematic view of the 3D semiconductor structure 20 shown in FIG. 16.

In an embodiment, the method according to the present disclosure can form in the opening 1091 (which is shown in FIG. 11) two (multilayer) stacks, e.g., a third stack and a fourth stack. For example, the fourth stack can be stacked over the third stack, the third stack can include a third middle metal layer having a third thickness different from the first thickness d1, and the fourth stack can include a fourth middle metal layer having a fourth thickness different from the second thickness d2. Therefore, a semiconductor structure thus formed can include two VFETs in height and two VEFTs in width, these four VFETs can have four different channel lengths (or gate electrode lengths), and the right VFETs (which can form a CFET) can have two different spacer lengths, both of which are different from the spacer lengths of the right CFET.

Figure 17:
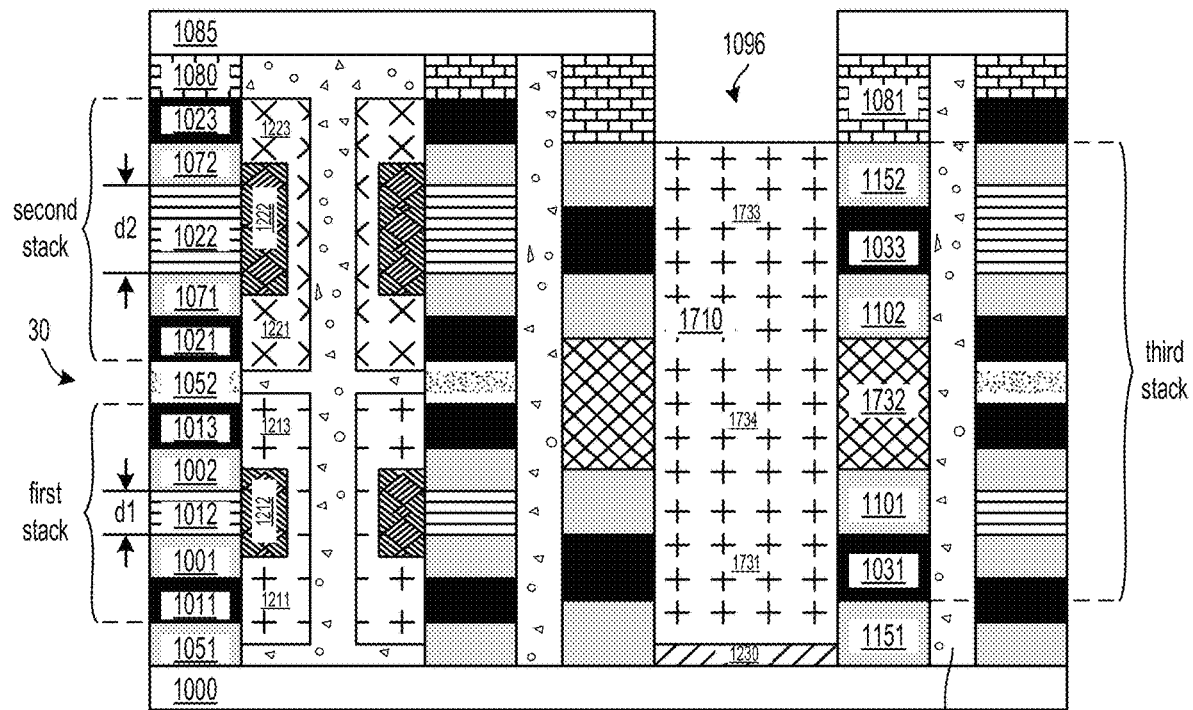
FIGS. 17-19 are cross-sectional views illustrating an exemplary method for fabricating a 3D semiconductor structure that includes a plurality of 3D semiconductor devices with different channel lengths according to some embodiments of the present disclosure.
Figure 18:
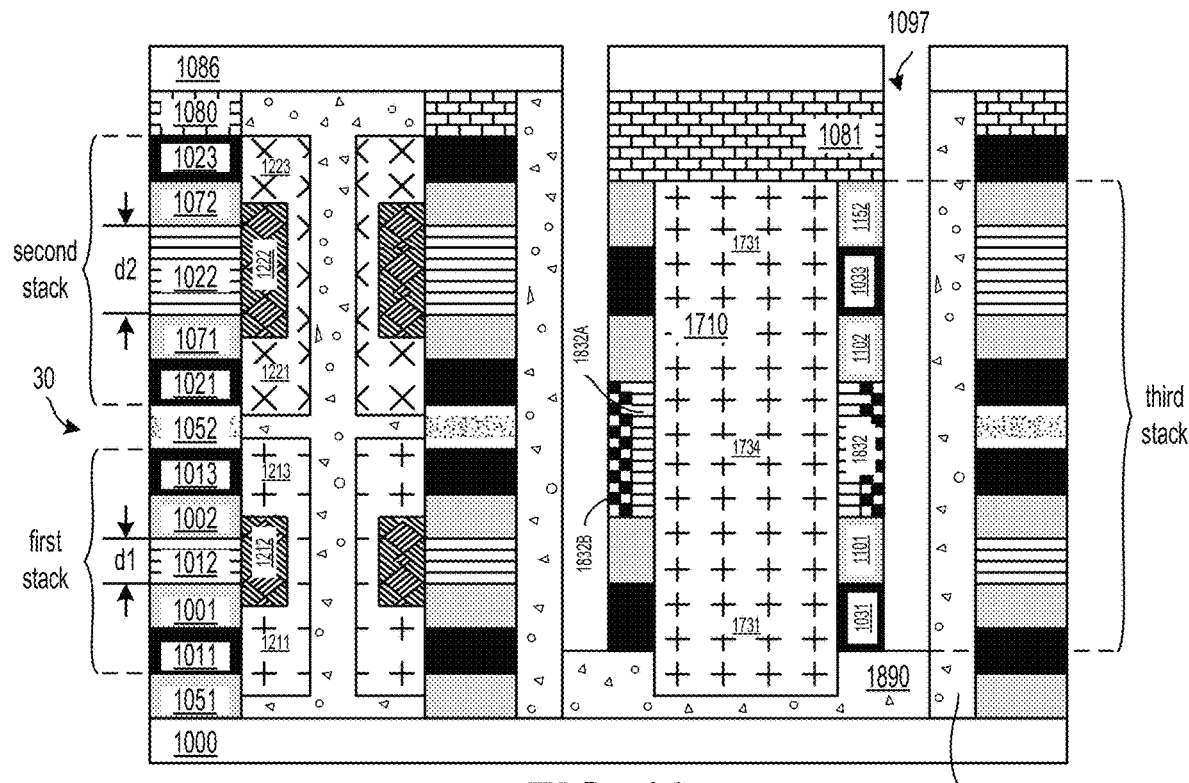
Figure 19:
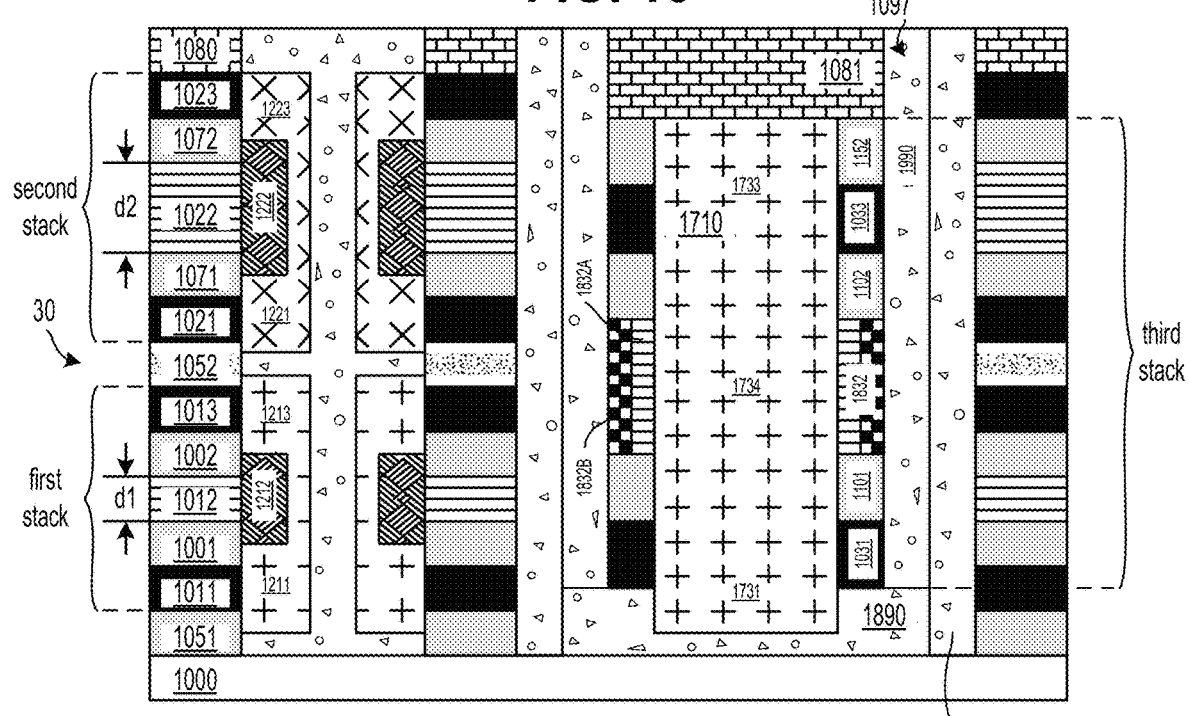

FIGS. 17-19 are cross-sectional views illustrating an exemplary method for fabricating a 3D semiconductor structure 30 that includes a plurality of 3D semiconductor devices with different channel lengths according to some embodiments of the present disclosure. In an embodiment, the semiconductor structure 30 can include at least two (N>=2) VFETs in width (e.g., a left VFET and a right VFET) and the left and right VFETs can include at least two (N>=2) vertically stacked VFETs with gate metal first and at least one (N>=1) VFET with gate metal last, respectively. As shown in FIG. 17, which follows FIG. 14 except that the third middle metal layer 1032 is replaced with a third middle dielectric layer 1732, a PR mask 1085 can be patterned by photolithograph, for example, and formed to cover the entire left vertical CFET and liner 1190 and a portion of the third stack, and the rest of the third stack that is not covered by the PR mask 1085 can be etched downward until uncovering the top surface of the substrate 1000, to form an opening 1096, which is cylindrical, for example. The PR mask 1085 can then be removed. A (sacrificial) epitaxial material, e.g., the third epitaxial material 1230, can be formed (e.g., epitaxially grown) on the substrate 1000 and a channel material 1710, e.g., the P type epitaxial material, can be formed (e.g., epitaxially grown) on the third epitaxial material 1230 and aligned with the top dielectric layer 1152 of the third stack to form a third lower S/D region 1731, a third channel 1734 and an upper lower S/D region 1733 of the third VFET. The third channel 1734 has a third length corresponding to the third thickness of the third middle dielectric layer 1732.

As shown in FIG. 18, the cap layer 1081 can be deposited to cover the channel material 1710 of the third stack and planarized using CMP, for example. A PR mask 1086 can be patterned by photolithograph, for example, and formed to cover the entire left vertical CFET and liner 1190 and a portion of the third stack, and the rest of the third stack that is not covered by the PR mask 1086 can be etched downward until uncovering the top surface of the substrate 1000, to form an opening 1097. The PR mask 1086 can then be removed. The bottom dielectric layer 1151 (which is shown in FIG. 17), which is etched selectively with respect to the third lower dielectric layer 1101, the third upper dielectric layer 1102 and the top dielectric layer 1152, can be etched and removed to uncover a portion of the top surface of the substrate 1000, and the portion of the top surface and the third epitaxial material 1230 can be oxidized to form a dielectric layer 1890, which includes $SiO_2$ or SiGeO, for example.

Also shown in FIG. 18, the third middle dielectric layer 1732 (which is shown in FIG. 17), which is etched selectively with respect to the dielectric layer 1890, the third lower dielectric layer 1101, the third upper dielectric layer 1102 and the top dielectric layer 1152, can be etched and removed. For example, the third middle dielectric layer 1732 can be etched by isotropic etching, such as vapor-phase etching. The third middle dielectric layer 1732 can be replaced with a gate material 1832A and a metal material 1832B to form a third gate region 1832 of the third VFET. In an embodiment, the gate material 1832A can include a high-k material. In another embodiment, the metal material 1832B can include two or more dielectric layered metal. The excess metal material 1832B can be etched such that the metal material 1832B can be aligned with the edge of the cap layer 1081. Accordingly, the S/D of the third VFET can be formed first and the gate can be formed last.

As shown in FIG. 19, a dielectric layer 1990 can be deposited to fill the opening 1097 and planarized using CMP, for example.

Figure 19A:
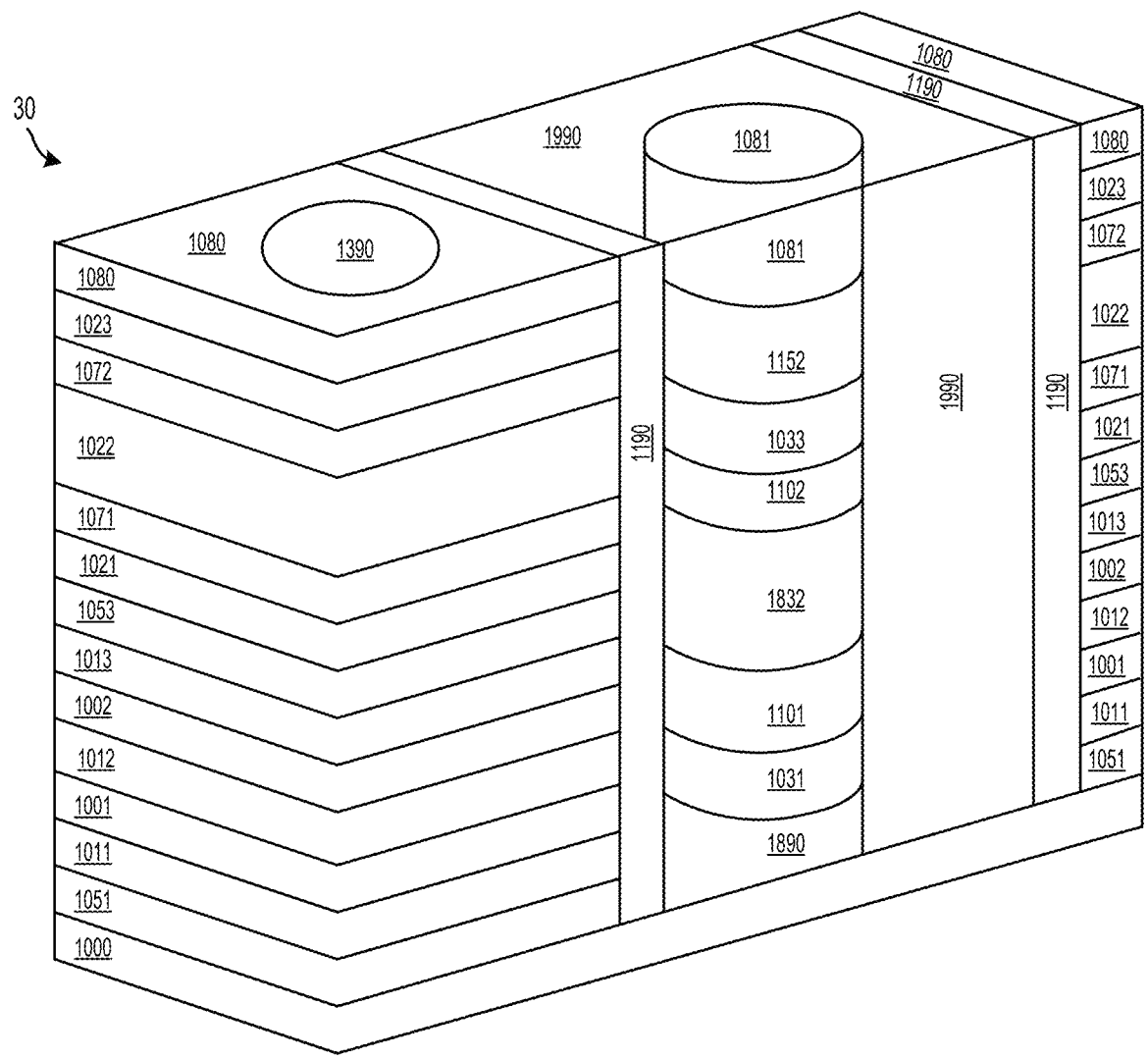
FIG. 19A is a schematic view of the 3D semiconductor structure shown in FIG. 19.

Therefore, the left vertical CFET and the right VFET of the 3D semiconductor structure 30 thus formed can have three different channel lengths (or gate electrode lengths), and the right VFET can have two different spacer lengths, both of which are different from the spacer lengths of the left vertical CFET. FIG. 19A is a schematic view of the 3D semiconductor structure 30 shown in FIG. 19.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the disclosure. The substrate may include any material portion or structure of a device, particularly a semiconductor or other electronics device, and may, for example, be a base substrate structure, such as a semiconductor wafer, reticle, or a dielectric layer on or overlying a base substrate structure such as a thin film. Thus, substrate is not limited to any particular base structure, underlying dielectric layer or overlying dielectric layer, patterned or un-patterned, but rather, is contemplated to include any such dielectric layer or base structure, and any combination of dielectric layers and/or base structures. The description may reference particular types of substrates, but this is for illustrative purposes only.

Those skilled in the art will also understand that there can be many variations made to the operations of the techniques explained above while still achieving the same objectives of the disclosure. Such variations are intended to be covered by the scope of this disclosure. As such, the foregoing descriptions of embodiments of the disclosure are not intended to be limiting. Rather, any limitations to embodiments of the disclosure are presented in the following claims.

What is claimed is:

1. A method for fabricating a three-dimensional (3D) semiconductor structure, comprising:
   forming a first multilayer stack over a substrate, the first multilayer stack including a plurality of first layers;
   forming a second multilayer stack over the first multilayer stack, the second multilayer stack including a plurality of second layers;
   forming a first opening through the first and second multilayer stack until uncovering a top surface of the substrate;
   forming in the first opening a first vertical field-effect transistor (VFET) over the substrate, the first VFET including a first channel having a first length corresponding to a first thickness of a first layer of the first multilayer stack; and
   forming in the first opening a second VFET over the first VFET, the second VFET including a second channel having a second length corresponding to a second thickness of a second layer of the second multilayer stack,
   wherein the second thickness is different from the first thickness, and
   the first VFET is formed by forming an epitaxial material on the substrate, growing a channel material on the epitaxial material to cover a vertical wall of the first layer to form the first channel, forming an opening through the channel material, and replacing the epitaxial material with a dielectric material.

2. The method of claim 1, further comprising:
   forming a second opening through the first and second multilayer stacks until uncovering the top surface of the substrate;
   forming in the second opening a third multilayer stack over the substrate, the third multilayer stack including a plurality of third layers;
   forming a third opening through the third multilayer stack until uncovering the top surface of the substrate; and
   forming in the third opening a third VFET over the substrate, the third VFET including a third channel having a third length corresponding to a third thickness of a third layer of the third multilayer stack,
   wherein the third thickness is different from the first thickness.

3. The method of claim 2, further comprising forming in the second opening a liner between the first and second multilayer stack and the third multilayer stack.

4. The method of claim 2, wherein the third layer is a dielectric layer, and the method further comprises:
   removing the dielectric layer;
   coupling a third gate material to the third channel; and
   coupling a third metal material to the third gate material.

5. The method of claim 2, wherein the third layer is a metal layer.

6. The method of claim 2, wherein the first and third openings have different sizes and/or shapes.

7. The method of claim 2, wherein the second opening is cylindrical.

8. The method of claim 1, wherein at least one of the first and second layers is a metal layer.

9. The method of claim 1, wherein the first and second channels include different types of channel materials.

10. A method for fabricating a three-dimensional (3D) semiconductor structure, comprising:
    forming a first multilayer stack over a substrate, the first multilayer stack including a plurality of first layers;
    forming a second multilayer stack over the first multilayer stack, the second multilayer stack including a plurality of second layers;
    forming a first opening through the first and second multilayer stack until uncovering a top surface of the substrate;
    forming in the first opening a first vertical field-effect transistor (VFET) over the substrate, the first VFET including a first channel having a first length corresponding to a first thickness of a first layer of the first multilayer stack, a portion of the first layer has a third thickness different from the first thickness to form a third layer of a third multilayer stack over the substrate;

forming in the first opening a second VFET over the first VFET, the second VFET including a second channel having a second length corresponding to a second thickness of a second layer of the second multilayer stack, the second thickness being different from the first thickness;

forming a second opening through the third multilayer stack until uncovering the top surface of the substrate; and forming in the second opening a third VFET over the substrate, the third VFET including a third channel having a third length corresponding to the third thickness of the third layer.

11. The method of claim 10, wherein the first multilayer stack is formed by forming the first layer, etching the first layer such that the portion of the first layer has the third thickness to form the third layer, and forming a dielectric layer on the third layer until being aligned with the first layer.

12. The method of claim 10, wherein a portion of the second layer has a fourth thickness different from the second thickness to form a fourth layer of a fourth multilayer stack, and the method further comprises:

forming in the second opening the fourth VFET over the third VFET, the fourth VFET including a fourth channel having a fourth length corresponding to the fourth thickness of the fourth layer.

13. The method of claim 10, wherein the first and second openings have different sizes and/or shapes.

14. The method of claim 10, wherein the first VFET is formed by forming an epitaxial material on the substrate, growing a channel material on the epitaxial material to cover a vertical wall of the first layer to form the first channel, forming an opening through the channel material, and replacing the epitaxial material with a dielectric material.

15. A method for fabricating a 3D semiconductor structure, comprising:

forming over a substrate a multilayer stack that includes a plurality of layers, first and second portions of one of the layers having different first and second thicknesses, respectively;

forming a first opening through a first portion of the multilayer stack that includes the first portion of the layer until uncovering a top surface of the substrate;

forming in the first opening a first VFET over the substrate, the first VFET including a first channel having a first length corresponding to the first thickness of the first portion of the layer;

forming a second opening through a second portion of the multilayer stack that includes the second portion of the layer until uncovering the top surface of the substrate; and forming in the second opening a second VFET over the substrate, the second VFET including a second channel having a second length corresponding to the second thickness of the second portion of the layer.

16. The method of claim 15, wherein the first and second openings have different sizes and/or shapes.

17. The method of claim 15, wherein the layer of the multilayer stack is a metal layer.

\* \* \* \* \*

UNITED STATES PATENT AND TRADEMARK OFFICE
CERTIFICATE OF CORRECTION

| | | |
|---|---|---|
| PATENT NO. | : 12,342,603 B2 | Page 1 of 1 |
| APPLICATION NO. | : 17/592032 | |
| DATED | : June 24, 2025 | |
| INVENTOR(S) | : Fulford et al. | |

It is certified that error appears in the above-identified patent and that said Letters Patent is hereby corrected as shown below:

In the Claims

In Column 14, Claim 10, Line 58, delete "lavers;" and insert -- layers; --, therefor.

Signed and Sealed this
Eleventh Day of November, 2025

John A. Squires
*Director of the United States Patent and Trademark Office*